(12) United States Patent
Wang et al.

(10) Patent No.: US 11,626,335 B2
(45) Date of Patent: Apr. 11, 2023

(54) IC PACKAGING STRUCTURE AND IC PACKAGING METHOD

(71) Applicant: Forehope Electronic (Ningbo) Co., Ltd., Ningbo (CN)

(72) Inventors: Shunbo Wang, Ningbo (CN); Lei Zhong, Ningbo (CN)

(73) Assignee: Forehope Electronic (Ningbo) Co., Ltd., Ningbo (CN)

( * ) Notice: Subject to any disclaimer, the term of this patent is extended or adjusted under 35 U.S.C. 154(b) by 219 days.

(21) Appl. No.: 17/223,739

(22) Filed: Apr. 6, 2021

(65) Prior Publication Data

US 2021/0366797 A1    Nov. 25, 2021

(30) Foreign Application Priority Data

May 22, 2020    (CN) .......................... 202010444402.6

(51) Int. Cl.
| | | |
|---|---|---|
| *H01L 23/28* | (2006.01) | |
| *H01L 23/13* | (2006.01) | |
| *H01L 21/56* | (2006.01) | |
| *H01L 23/31* | (2006.01) | |
| *H01L 23/00* | (2006.01) | |

(52) U.S. Cl.
CPC .............. *H01L 23/13* (2013.01); *H01L 21/56* (2013.01); *H01L 23/3135* (2013.01); *H01L 24/29* (2013.01); *H01L 24/32* (2013.01); *H01L 24/73* (2013.01); *H01L 21/561* (2013.01); *H01L 2224/29139* (2013.01); *H01L 2224/32225* (2013.01); *H01L 2224/73265* (2013.01); *H01L 2924/351* (2013.01)

(58) Field of Classification Search
CPC ..... H01L 23/13; H01L 23/3135; H01L 21/56; H01L 24/32; H01L 2924/35; H01L 2924/351
USPC .................................. 257/784, 787; 438/127
See application file for complete search history.

(56) References Cited

U.S. PATENT DOCUMENTS

| | | | | |
|---|---|---|---|---|
| 5,150,197 A | * | 9/1992 | Hamburgen | ............ H01L 23/13 257/713 |
| 5,171,716 A | * | 12/1992 | Cagan | ................. H01L 23/3157 257/E23.129 |
| 5,187,020 A | * | 2/1993 | Kwon | ..................... H01L 24/81 428/626 |
| 5,667,884 A | * | 9/1997 | Bolger | ............. H01L 23/49883 428/323 |
| 5,903,046 A | * | 5/1999 | Brooks | ................. H01L 23/293 257/632 |

(Continued)

*Primary Examiner* — Nitin Parekh
(74) *Attorney, Agent, or Firm* — Casimir Jones, SC; Robert A. Goetz

(57) ABSTRACT

Embodiments of the present disclosure provide an IC packaging structure and an IC packaging method, relating to the chip packaging field. The IC packaging structure includes: a substrate, a stress buffer sheet mounted on the substrate; a packaged chip mounted on the stress buffer sheet, and a plastic package body coated outside the packaged chip, wherein the packaged chip is electrically connected to the substrate, and the stress buffer sheet is used for buffering stress acting on the packaged chip. Compared with the prior art, in the IC packaging structure provided in the present disclosure, the stress buffer sheet is mounted on the substrate through silver glue, the packaged chip is mounted on the stress buffer sheet through silver glue.

10 Claims, 3 Drawing Sheets

(56) References Cited

U.S. PATENT DOCUMENTS

| | | | | |
|---|---|---|---|---|
| 6,168,974 B1 * | 1/2001 | Chang | ................ | H01L 23/3114 |
| | | | | 438/117 |
| 6,197,613 B1 * | 3/2001 | Kung | ................ | H01L 23/3107 |
| | | | | 438/618 |
| 6,277,669 B1 * | 8/2001 | Kung | ................ | H01L 24/13 |
| | | | | 257/E23.021 |
| 6,399,178 B1 * | 6/2002 | Chung | ................ | H01L 24/81 |
| | | | | 257/E21.511 |
| 7,348,261 B2 * | 3/2008 | Caletka | ................ | H01L 24/32 |
| | | | | 438/464 |
| 8,003,441 B2 * | 8/2011 | Maeda | ................ | H01L 24/27 |
| | | | | 438/464 |
| 10,962,434 B2 * | 3/2021 | Ikesho | ................ | G01L 19/14 |
| 2004/0201074 A1 * | 10/2004 | Khandros | ................ | H01L 24/13 |
| | | | | 257/E23.021 |

* cited by examiner

IC PACKAGING STRUCTURE AND IC PACKAGING METHOD

CROSS-REFERENCE TO RELATED APPLICATION

The present disclosure claims the priority to the Chinese patent application with the filing number 2020104444026 filed on May 22, 2020 with the Chinese Patent Office, and entitled "IC Packaging Structure and IC Packaging Method", the contents of which are incorporated herein by reference in entirety.

TECHNICAL FIELD

The present disclosure relates to the field of chip packaging, in particular, to an IC packaging structure and an IC packaging method.

BACKGROUND ART

With the rapid development of the semiconductor industry, a wire bonding BGA product structure (WBBGA) is widely applied to integrated circuit package electronic products, which has the advantages of high I/O pin count and small packaging dimension, and under the condition that the integration level is continuously improved, the WBBGA (wire bonding ball array) technology is used more and more widely in light, thin, short, small, multifunctional and highly reliable electronic products. Generally, a face-up chip is connected to the circuit at the bottom of the substrate through a wire bonding process, and as a stress caused by mismatch of coefficients of thermal expansion of a chip material silicon (the coefficient of thermal expansion is 2.5 ppm/C) with the substrate material (the coefficient of thermal expansion is 12 ppm/C) and the material (wire material and silver colloid) in a packaging body acts on the face-up chip, the stress causes degradation and even invalidation of the performance of the product.

SUMMARY

Embodiments of the present disclosure may be realized as follows.

An embodiment of the present disclosure provides an IC packaging structure, including:
a substrate;
a stress buffer sheet mounted on the substrate;
a packaged chip mounted on the stress buffer sheet; and
a plastic package body coated outside the packaged chip, wherein
the packaged chip is electrically connected to the substrate, and the stress buffer sheet is used for buffering stress acting on the packaged chip.

An embodiment of the present disclosure provides an IC packaging method, including the following steps:
mounting a stress buffer sheet on a substrate;
mounting a packaged chip on the stress buffer sheet; and
forming a plastic package body coated outside the packaged chip, wherein
the packaged chip is electrically connected to the substrate, and the stress buffer sheet is used for buffering stress acting on the packaged chip.

BRIEF DESCRIPTION OF DRAWINGS

In order to more clearly illustrate technical solutions of embodiments of the present disclosure, accompanying drawings which need to be used in the embodiments will be introduced below briefly, and it should be understood that the accompanying drawings below merely show some embodiments of the present disclosure, and therefore should not be considered as limitation on the scope, and a person ordinarily skilled in the art still could obtain other relevant accompanying drawings according to these accompanying drawings, without using any creative effort.

Figure 1:
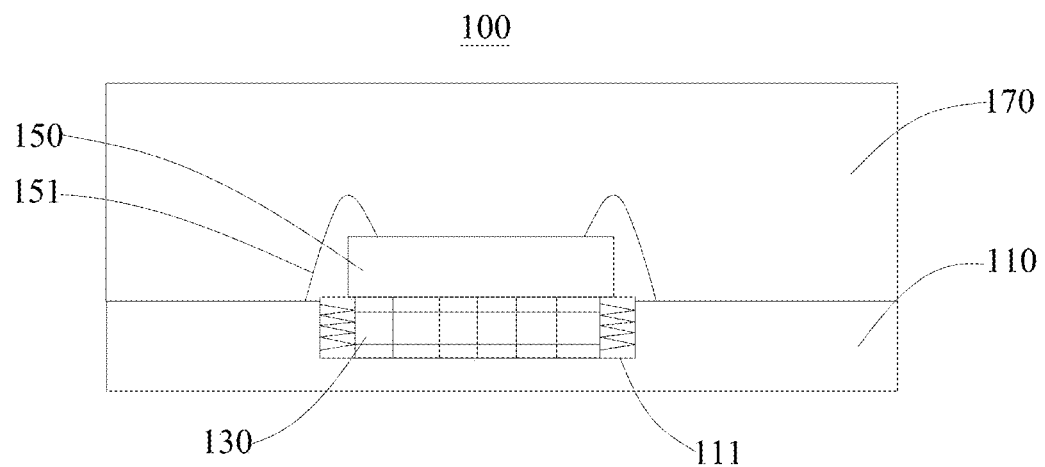
FIG. 1 is a schematic view of an IC packaging structure provided in the present disclosure.

Reference signs: 100—IC packaging structure; 110—substrate; 111—groove; 130—stress buffer sheet; 131—base material; 133—mesh structure; 135—spring structure; 150—packaged chip; 151—connection line; 170—plastic package body; 190—glue layer.

DETAILED DESCRIPTION OF EMBODIMENTS

In order to make objectives, technical solutions and advantages of the embodiments of the present disclosure clearer, the technical solutions in the embodiments of the present disclosure will be described clearly and completely below in conjunction with the accompanying drawings in the embodiments of the present disclosure, and apparently, some but not all embodiments of the present disclosure are described. Generally, components in the embodiments of the present disclosure described and shown in the accompanying drawings herein may be arranged and designed in various different configurations.

Therefore, the detailed description below of the embodiments of the present disclosure provided in the accompanying drawings is not intended to limit the scope of protection of the present disclosure, but merely represents chosen embodiments of the present disclosure. Based on the embodiments of the present disclosure, all of other embodiments obtained by those ordinarily skilled in the art, without any creative efforts, shall fall within the scope of protection of the present disclosure.

It should be noted that similar reference signs and letters represent similar items in the following accompanying drawings, therefore, once a certain item is defined in one accompanying drawing, it is not needed to be further defined or explained in subsequent accompanying drawings.

In the description of the present disclosure, it should be indicated that orientation or positional relationships indicated by terms such as "upper", "lower", "inner", and "outer" are based on orientation or positional relationships as shown in the figures, or orientation or positional relationships of a product of the present disclosure when being conventionally placed in use, merely for facilitating describing the present disclosure and simplifying the description, rather than indicating or suggesting that related devices or elements have to be in the specific orientation or configured and operated in a specific orientation, therefore, they should not be construed as limitation to the present disclosure.

Besides, terms such as "first" and "second" are merely for distinctive description, but should not be construed as indicating or implying importance in the relativity.

It should be indicated that the features in the embodiments of the present disclosure may be combined with each other if there is no conflict.

Objectives of the present disclosure include, for example, providing an IC packaging structure and an IC packaging method, which can buffer stress applied to a chip, and avoid the degradation of product performance caused by the stress.

Embodiments of the present disclosure may be realized as follows.

In a first aspect, an embodiment of the present disclosure provides an IC packaging structure, including:
a substrate;
a stress buffer sheet mounted on the substrate;
a packaged chip mounted on the stress buffer sheet; and
a plastic package body coated outside the packaged chip;
in the above, the packaged chip is electrically connected to the substrate, and the stress buffer sheet is used for buffering stress acting on the packaged chip.

In an optional embodiment, the stress buffer sheet includes a base material, a mesh structure embedded in the middle of the base material and a spring structure embedded at two ends of the base material, the mesh structure is used for buffering the stress acting on the packaged chip, and the spring structure is used for buffering internal stress of the substrate.

In an optional embodiment, the mesh structure is made of metal or high molecular weight polymer.

In an optional embodiment, the substrate is provided with a groove, and the stress buffer sheet is mounted in the groove.

In an optional embodiment, the depth of the groove is the same as the thickness of the stress buffer sheet, so that the stress buffer sheet is flush with the surface of the substrate around the groove.

In an optional embodiment, the packaged chip is mounted, in a face-up manner, on the stress buffer sheet, and the packaged chip is provided with a connection line connected to the substrate, so that the packaged chip is electrically connected to the substrate.

In an optional embodiment, the packaged chip is provided thereon with a surface protection layer, the surface protection layer is coated with a glue layer, the plastic package body is coated outside the glue layer, and Young's modulus of the glue layer is lower than that of the surface protection layer.

In an optional embodiment, the Young's modulus of the glue layer is lower than 3400 MPa.

In a second aspect, an embodiment of the present disclosure provides an IC packaging method, including the following steps:
mounting a stress buffer sheet on a substrate;
mounting a packaged chip on the stress buffer sheet; and
forming a plastic package body coated outside the packaged chip;
in the above, the packaged chip is electrically connected to the substrate, and the stress buffer sheet is used for buffering stress acting on the packaged chip.

In an optional embodiment, before the step of forming a plastic package body coated outside the packaged chip, the method further includes:
forming a glue layer coated outside the packaged chip.

Beneficial effects of the embodiments of the present disclosure include, for example:

by mounting the stress buffer sheet on the substrate, and mounting the packaged chip on the stress buffer sheet, the stress acting the packaged chip is buffered by the stress buffer sheet, the packaged chip is avoided from being directly mounted on the substrate, thus avoiding the stress caused by the mismatch of coefficients of thermal expansion from acting on the face-up packaged chip, and avoiding the degradation of performance of the packaged chip caused by the stress.

Through researches, the inventors found that in the prior art, the conventional wire bonding BGA product structure is usually mounted on a substrate using a face-up chip, and is connected to a circuit at the bottom of the substrate through a wiring process, that is to say, the face-up chip is directly mounted on the substrate. As the coefficients of thermal expansion of the substrate material, the material inside the chip and the pasting material (silver glue) are quite different, it will cause the problem of mismatch of coefficients of thermal expansion, then the thermal stress acts on the face-up chip, thus affecting the product performance. Besides, the existing BGA product usually has the chip mounted on a planar substrate, which leads to relatively large thermal stress due to the mismatch of coefficients of thermal expansion, and affects the product performance.

The present disclosure provides a novel IC packaging structure, which buffers the stress acting on a chip by additionally providing a stress buffer sheet, so as to prevent the thermal stress caused by the mismatch of coefficients of thermal expansion from directly acting on the chip and affecting the chip performance.

Figure 2:
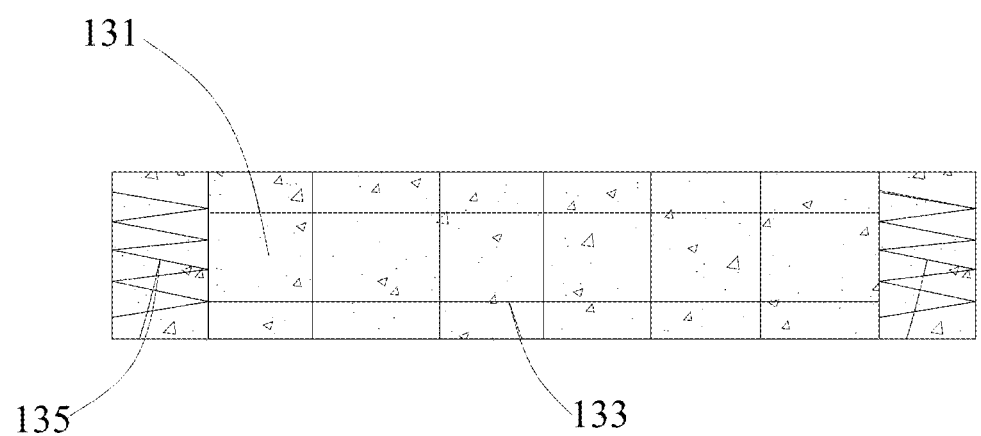
FIG. 2 is a structural schematic view of a stress buffer sheet in FIG. 1.

Referring to FIG. 1 and FIG. 2, the present embodiment provides an IC packaging structure 100, which can buffer stress acting on a chip, and prevent thermal stress caused by the mismatch of coefficients of thermal expansion from directly acting on the chip and affecting the chip performance.

The IC packaging structure 100 provided in the present embodiment includes: a substrate 110, a stress buffer sheet 130 mounted on the substrate 110, a packaged chip 150 mounted on the stress buffer sheet 130, and a plastic package body 170 coated outside the packaged chip 150, wherein the packaged chip 150 is electrically connected to the substrate 110, and the stress buffer sheet 130 is used for buffering stress acting on the packaged chip 150.

In the present embodiment, the stress buffer sheet 130 is mounted on the substrate 110 by silver glue, and the packaged chip 150 is mounted on the stress buffer sheet 130 by silver glue. The stress buffer sheet 130 has a certain deformation capability, and buffering the stress acting on the packaged chip 150 by the stress buffer sheet 130 avoids directly mounting the packaged chip 150 on the substrate 110, thereby avoiding the stress caused by the mismatch of coefficients of thermal expansion from acting on the face-up packaged chip 150, and avoiding the performance degradation of the packaged chip 150 caused by the stress.

In the present embodiment, the substrate 110 is provided with a groove 111, and the stress buffer sheet 130 is mounted in the groove 111. Specifically, the groove 111 reserved for the stress buffer sheet 130 is formed through laser grooving on the surface of the substrate 110, and the shape/dimension of the groove 111 is matched with the stress buffer sheet 130, so that the stress buffer sheet 130 can be fitted and mounted in the groove 111, and during the mounting, silver glue may be dispensed in the groove 111, and then the stress buffer sheet 130 is mounted in the groove 111.

In the present embodiment, the depth of the groove 111 is the same as the thickness of the stress buffer sheet 130, so that the stress buffer sheet 130 is flush with the surface of the substrate 110 around the groove 111. Specifically, the thickness of the stress buffer sheet 130 refers to the thickness including a glue layer 190, that is, the stress buffer sheet 130 is flush with the surface of the substrate 110 after pasting.

The stress buffer sheet 130 includes a base material 131, a mesh structure 133 embedded in the middle of the base material 131 and a spring structure 135 embedded at two ends of the base material 131, wherein the mesh structure 133 is used for buffering the stress acting on the packaged chip 150, and the spring structure 135 is used for buffering internal stress of the substrate 110. Specifically, the packaged chip 150 is smaller than the stress buffer sheet 130 in dimension, and is mounted in a region where the mesh structure 133 of the stress buffer sheet 130 is located.

The combination of the mesh structure 133 and the spring structure 135 may effectively overcome the stress in the X/Y/Z (three-dimensional) direction inside the packaging structure, the mesh structure 133 may effectively overcome the stress acting on the packaged chip 150, and the stress buffer spring may be elastically deformed on the substrate 110, so as to buffer the stress, of which the principle is similar to cement road slotting, wherein stress is released, and the thermal expansion and contraction deformation is absorbed, so that the deformation occurs first to the part of material designed at the bottom of the packaged chip 150.

In the present embodiment, the mesh structure 133 is made of metal or high molecular weight polymer. Specifically, the material of the base material 131 adopts a material having a coefficient of thermal expansion close to that inside the packaged chip 150 as a stack material, and the internal mesh structure 133 thereof serves to internally buffer stress and support.

It should be noted that, in the present embodiment, the stress buffer sheet 130 is made by laminating the base material 131, wherein after a layer of base material 131 is first placed, a layer of copper is laminated, and then the mesh structure 133 and the spring pattern are laminated on the surface thereof, and an area which does not need to be etched is protected with a protection film, the mesh structure 133 and the spring structure 135 are shaped in an etching manner, and then the base material 131 is laminated on the surface thereof, thereby completing the manufacture of the stress buffer sheet 130.

In the present embodiment, the packaged chip 150 is mounted, in a face-up manner, on the stress buffer sheet 130, and a connection line 151 connected to the substrate 110 is provided on the packaged chip 150, so that the packaged chip 150 is electrically connected to the substrate 110. Specifically, the dimension of the stress buffer sheet 130 is larger than that of the packaged chip 150, so that the packaged chip 150 can be mounted, in a face-up manner, on the stress buffer sheet 130. The packaged chip 150 is mounted on the surface of the stress buffer sheet 130 using thermally conductive glue or silver glue, and is electrically connected to the substrate 110 through the connection line 151. The connection line 151 is a conventional gold wire, a silver wire, a copper wire or the like.

In the IC packaging structure 100 provided in the present embodiment, the surface of the substrate 110 is grooved using laser, to form the groove 111 reserved for the stress buffer sheet 130. The stress buffer sheet 130 is mounted in the groove 111, and the height/dimension of the groove 111 is consistent with the stress buffer sheet 130, to solve the problem of placement of the stress buffer sheet 130, wherein the stress buffer sheet 130 is made by laminating the base material 131, and wherein after a layer of base material 131 is placed first, a layer of copper is laminated, the mesh structure 133 and the spring pattern are laminated on the surface thereof, and an area which does not need to be etched is protected with a protection film, the mesh structure 133 and the spring structure 135 are completed in an etching manner, and then the base material 131 is laminated on the surface thereof to complete the manufacture of the stress buffer sheet 130, wherein the dimension of the stress buffer sheet needs to be larger than that of the face-up packaged chip 150. The stress buffer sheet 130 is mounted. The structure of the stress buffer sheet 130 is composed of the mesh structure 133, the base material 131, and the spring structure 135. The combination of the mesh structure 133 and the spring structure 135 may effectively overcome the stress in the X/Y/Z direction inside the packaging structure. The spring structure 135 may effectively buffer the internal stress of the substrate 110, the mesh structure 133 may effectively overcome the stress acting on the chip, thus avoiding the thermal stress due to the mismatch of the coefficients of thermal expansion from directly acting on the chip and affecting the chip performance.

Figure 3:
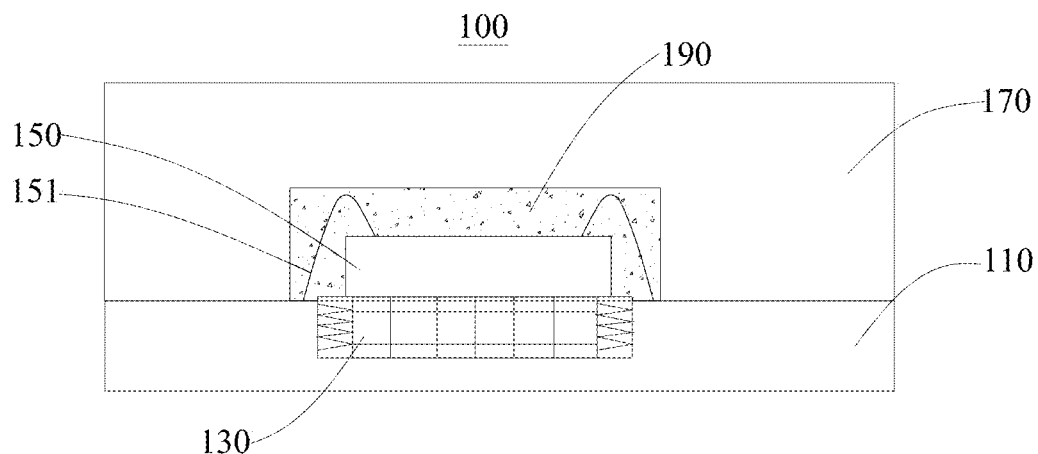
FIG. 3 is a schematic view of the IC packaging structure provided in the present disclosure.

Referring to FIG. 3, the present embodiment provides an IC packaging structure 100, of which the basic structure and principle as well as the technical effect produced are the same as those in the first embodiment, and for the sake of concise description, reference may be made to corresponding contents in the first embodiment for contents which are not mentioned in the part of the present embodiment.

In the present embodiment, the packaged chip 150 is provided thereon with a surface protection layer, the surface protection layer is coated with the glue layer 190, the plastic package body 170 is coated outside the glue layer 190, and Young's modulus of the glue layer 190 is lower than that of the surface protection layer. Specifically, before plastic packaging, the glue is dispensed above wire arc and the packaged chip 150, and at any temperature between −65° C. and 280° C., the Young's modulus of the glue is lower than the Young's modulus of the surface protection layer, and after the glue is cured, the glue layer 190 is formed. As the glue layer 190 is softer, the glue layer is deformed first under the action of thermal stress, thereby effectively protecting the wire arc and the packaged chip 150.

In the present embodiment, the Young's modulus of the glue layer 190 is lower than 3400 MPa. Specifically, the Young's modulus of the internal structure of the packaged chip 150 may be up to 131000 MPa, the surface protection layer of the packaged chip 150 is less than 10 μm, and the Young's modulus of the surface protection layer is 3400 MPa, so that the Young's modulus of the glue layer 190 can be ensured to be lower, and the glue layer 190 is softer, thereby effectively protecting the wire arc and the packaged chip 150.

Figure 4:
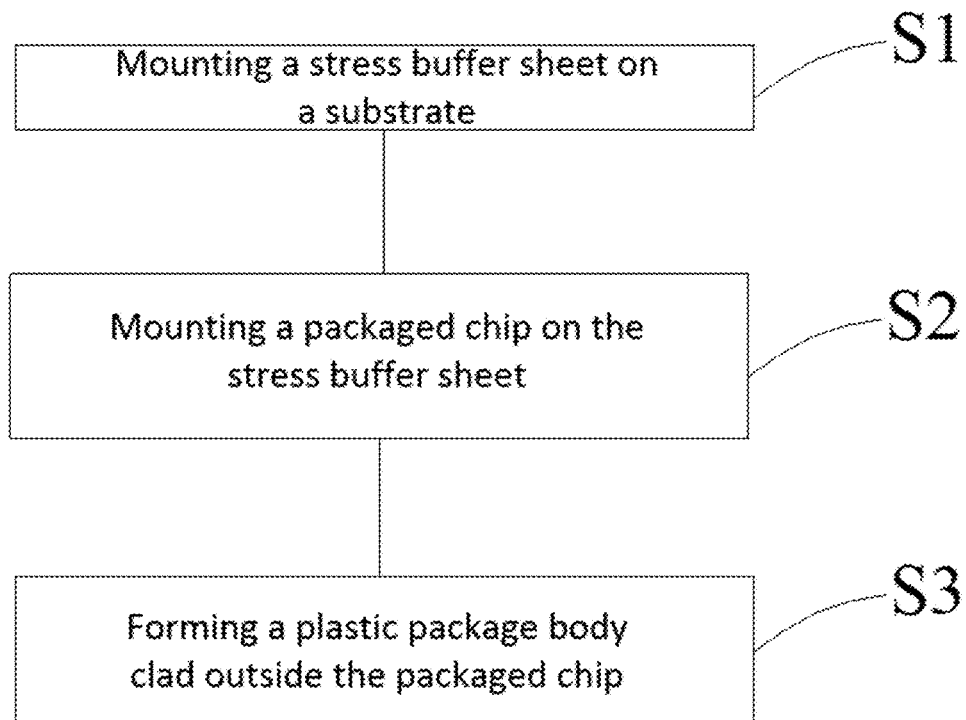
FIG. 4 is a block diagram of steps of an IC packaging method provided in the present disclosure.

Referring to FIG. 4, the present embodiment provides an IC packaging method, which is applicable to the IC packing structure 100 provided in the first embodiment, and the method includes the following steps:

S1: mounting a stress buffer sheet 130 on a substrate 110.

Specifically, a groove 111 is formed by laser grooving on the substrate 110, and the dimension/height of the groove 111 is matched with the stress buffer sheet 130, so that the stress buffer sheet 130 is mounted in the groove 111 through thermally conductive glue or silver glue.

In the above, the stress buffer sheet 130 has been manufactured before the packaging process, and specifically, the stress buffer sheet 130 is made by laminating the base material 131, wherein after a layer of base material 131 is first placed, a layer of copper is laminated, and then the mesh structure 133 and the spring pattern are laminated on the surface thereof, and an area which does not need to be etched is protected with a protection film, the mesh structure 133 and the spring structure 135 are shaped in an etching manner, and then the base material 131 is laminated on the surface thereof, thereby completing the manufacture of the stress buffer sheet 130.

S2: mounting a packaged chip 150 on the stress buffer sheet 130.

Specifically, the packaged chip 150 is mounted, in a face-up manner, on the stress buffer sheet 130 through the thermally conductive glue or silver glue, and the thermal stress acting on the packaged chip 150 is buffered by the stress buffer sheet 130. In the above, the mesh structure 133 of the stress buffer sheet 130 is used for buffering the stress acting on the packaged chip 150, and the spring structure 135 is used for buffering internal stress of the substrate 110.

In the above, the packaged chip 150 is electrically connected to the substrate 110, and the stress buffer sheet 130 is used for buffering the stress acting on the packaged chip 150.

After the mounting of the packaged chip 150 is completed, the packaged chip 150 needs to undergo wire bonding process, and electrical connection between the packaged chip 150 and the substrate 110 is realized through the connection line 151.

S3: forming a plastic package body 170 coated outside the packaged chip 150.

Specifically, the plastic package body 170 is formed using a plastic packaging machine, and the plastic package body 170 protects both the packaged chip 150 and the wire arc. After the plastic packaging, the product is cut into single pieces using a machine table, and finally packaging and delivery are carried out.

It should be noted that in the present embodiment, the stress buffer sheet 130 does not serve for electrical connection, and it mainly functions to buffer the stress acting on the packaged chip 150.

In practical operation, the IC packaging method provided in the present disclosure includes steps of manufacturing the substrate 110, mounting (pasting) the stress buffer sheet 130, pasting the packaged chip 150, baking, wire bonding, encapsulating, cutting, etc., specifically including:

1. manufacturing the substrate 110: providing the substrate 110, and grooving the substrate 110 by laser, and reserving the groove 111;

2. mounting the stress buffer sheet 130: mounting the stress buffer sheet 130 in the groove 111 through thermally conductive glue/silver glue;

3. pasting the packaged chip 150: mounting, in a face-up manner, the packaged chip 150 on the stress buffer sheet 130 through thermally conductive glue/silver glue;

4. baking: curing the face-up packaged chip 150 by baking;

5. wire bonding: connecting the packaged chip 150 to the circuit of the substrate 110 through the connection line 151;

6. encapsulating: plastically packaging the connected chip circuit through a plastic packaging material using a plastic packaging machine, to form the plastic package body 170 for protection; and 7. cutting: cutting the product into single pieces using a machine table, and carrying out packaging and delivery.

In the IC packaging method provided in the present embodiment, the grooving process is completed using laser on the surface of the substrate 110, and the groove is reserved for the stress buffer sheet 130. The stress buffer sheet 130 is mounted inside the groove 111. The structure of the stress buffer sheet 130 is composed of the mesh structure 133, the base material 131, and the spring structure 135. The combination of the mesh structure 133 and the spring structure 135 may effectively overcome the stress in the X/Y/Z direction inside the packaging structure. The spring structure 135 may effectively buffer the internal stress of the substrate 110, and the mesh structure 133 may effectively overcome the stress acting on the chip, thus avoiding the thermal stress due to the mismatch of the coefficients of thermal expansion from directly acting on the chip and affecting the chip performance.

Figure 5:
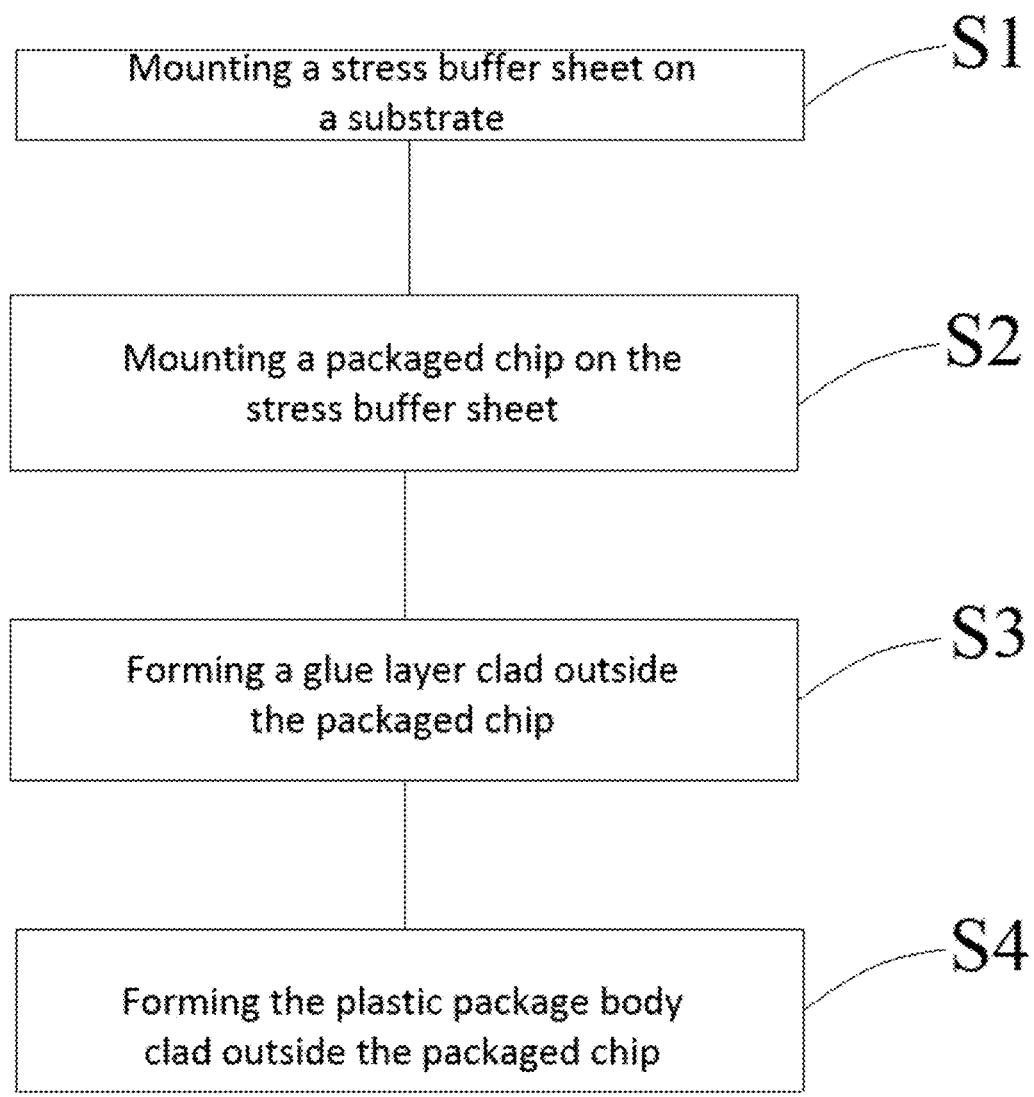
FIG. 5 is a block diagram of steps of the IC packaging method provided in the present disclosure.

Referring to FIG. 5, the present embodiment provides an IC packaging method, which is applicable to the IC packaging structure 100 provided in the second embodiment. The basic structure and principle as well as the technical effect produced of this method are the same as those in the third embodiment, and for the sake of concise description, reference may be made to corresponding contents in the third embodiment for contents which are not mentioned in the part of the present embodiment. This method includes the following steps:

S1: mounting the stress buffer sheet 130 on the substrate 110.

Specifically, the groove 111 is formed through laser grooving on the substrate 110, and the stress buffer sheet 130 is mounted in the groove 111.

S2: mounting the packaged chip 150 on the stress buffer sheet 130.

Specifically, the packaged chip 150 is mounted, in a face-up manner, on the stress buffer sheet 130, so that the packaged chip 150 is not in direct contact with the substrate 110. After the mounting is completed, wire bonding is performed, and the substrate 110 and the packaged chip 150 are electrically connected through the connection line 151.

S3: forming a glue layer 190 coated outside the packaged chip 150.

Specifically, the packaged chip 150 has a surface protection layer, and after the wire bonding is completed, the glue is dispensed above wire arc and the packaged chip 150, and at any temperature between −65° C. and 280° C., the Young's modulus of the glue is lower than the Young's modulus of the surface protection layer, and after the glue is cured, the glue layer 190 is formed. As the glue layer 190 is softer, the glue layer is deformed first under the action of thermal stress, thereby effectively protecting the wire arc and the packaged chip 150.

S4: forming the plastic package body 170 coated outside the packaged chip 150.

Specifically, the plastic package body 170 is formed using a plastic packaging machine, and the plastic package body 170 protects the packaged chip 150, the wire arc and the glue layer 190. After the plastic packaging, the product is cut into single pieces using a machine table, and finally packaging and delivery are carried out.

In practical operation, the IC packaging method provided in the present disclosure includes steps of manufacturing the substrate 110, mounting the stress buffer sheet 130, pasting the packaged chip 150, baking, wire bonding, dispensing glue, encapsulating, cutting, etc., specifically including:

1. manufacturing the substrate 110: providing the substrate 110, grooving the substrate 110 by laser, and reserving the groove 111;

2. mounting the stress buffer sheet 130: mounting the stress buffer sheet 130 in the groove 111 through thermally conductive glue/silver glue;

3. pasting the packaged chip 150: mounting, in a face-up manner, the packaged chip 150 on the stress buffer sheet 130 through thermally conductive glue/silver glue;

4. baking: curing the face-up packaged chip 150 by baking;

5. wire bonding: connecting the packaged chip 150 to a circuit of the substrate 110 through the connection line 151;

6. dispensing glue: dispensing glue above the connection line 151 and the packaged chip 150 to form the glue layer 190 after curing;

7. encapsulating: plastically packaging the connected chip circuit through a plastic packaging material using a plastic packaging machine, to form the plastic package body 170 for protection; and 8. cutting: cutting the product into single pieces using a machine table, and carrying out packaging and delivery.

According to the IC packaging method provided in the present disclosure, the glue layer 190 is additionally provided, as the glue layer 190 is softer, it is deforms first under the action of thermal stress, thereby effectively protecting the wire arc and the packaged chip 150.

The above-mentioned are merely for specific embodiments of the present disclosure, but the scope of protection of the present disclosure is not limited thereto, and changes and substitutions that may be readily envisaged by any person skilled familiar with the technical field within the technical scope disclosed in the present disclosure should fall within the scope of protection of the present disclosure. Therefore, the scope of protection of the present disclosure should be determined by the scope of protection of the claims.

INDUSTRIAL APPLICABILITY

By mounting (pasting) the stress buffer sheet on the substrate, and mounting (pasting) the packaged chip on the stress buffer sheet, the stress acting the packaged chip is buffered by the stress buffer sheet, the packaged chip is avoided from being directly mounted on the substrate, thus avoiding the stress caused by the mismatch of coefficients of thermal expansion from acting on the face-up packaged chip, and avoiding the degradation of performance of the packaged chip caused by the stress.

What is claimed is:

1. An integrated circuit (IC) packaging structure, comprising:
    a substrate;
    a stress buffer sheet mounted on the substrate;
    a packaged chip mounted on the stress buffer sheet; and
    a plastic package body coated outside the packaged chip,
    wherein the packaged chip is electrically connected to the substrate, and the stress buffer sheet is configured to buffer stress acting on the packaged chip, wherein the stress buffer sheet comprises a base material, a mesh structure embedded in a middle of the base material and a spring structure embedded at two ends of the base material, wherein the mesh structure is configured to buffer the stress acting on the packaged chip, and the spring structure is configured to buffer internal stress of the substrate.

2. The IC packaging structure according to claim 1, wherein the mesh structure is made of metal or high molecular weight polymer.

3. The IC packaging structure according to claim 2, wherein the substrate is provided with a groove, and the stress buffer sheet is mounted in the groove.

4. The IC packaging structure according to claim 1, wherein the substrate is provided with a groove, and the stress buffer sheet is mounted in the groove.

5. The IC packaging structure according to claim 4, wherein a depth of the groove is the same as a thickness of the stress buffer sheet, so that the stress buffer sheet is flush with a surface of the substrate around the groove.

6. The IC packaging structure according to claim 1, wherein the packaged chip is mounted, in a face-up manner, on the stress buffer sheet, and the packaged chip is provided with a connection line connected to the substrate, so that the packaged chip is electrically connected to the substrate.

7. The IC packaging structure according to claim 1, wherein the packaged chip is coated with a glue layer, the plastic package body is coated outside the glue layer, wherein the Young's modulus of the glue layer is lower than 3400 MPa.

8. The IC packaging structure according to claim 1, wherein the substrate is provided with a groove, and the stress buffer sheet is mounted in the groove.

9. An IC packaging method, comprising following steps:
    mounting a stress buffer sheet on a substrate;
    mounting a packaged chip on the stress buffer sheet; and
    forming a plastic package body coated outside the packaged chip,
    wherein the packaged chip is electrically connected to the substrate, and the stress buffer sheet is configured to buffer stress acting on the packaged chip, wherein the stress buffer sheet comprises a base material, a mesh structure embedded in a middle of the base material and a spring structure embedded at two ends of the base material, wherein the mesh structure is configured to buffer the stress acting on the packaged chip, and the spring structure is configured to buffer internal stress of the substrate.

10. The IC packaging method according to claim 9, wherein before the forming a plastic package body coated outside the packaged chip, the method further comprises:
    forming a glue layer coated outside the packaged chip.

* * * * *